(12) United States Patent
Yuan et al.

(10) Patent No.: US 10,600,939 B2
(45) Date of Patent: Mar. 24, 2020

(54) SOLID-STATE LIGHT EMITTING DEVICES AND SIGNAGE WITH PHOTOLUMINESCENCE WAVELENGTH CONVERSION AND PHOTOLUMINESCENT COMPOSITIONS THEREFOR

(71) Applicant: Intematix Corporation, Fremont, CA (US)

(72) Inventors: Xianglong Yuan, Manteca, CA (US); Bing Dai, Fremont, CA (US); Jonathan Melman, San Ramon, CA (US); Charles Edwards, Pleasanton, CA (US)

(73) Assignee: Intematix, Corporation, Fremont, CA (US)

( * ) Notice: Subject to any disclaimer, the term of this patent is extended or adjusted under 35 U.S.C. 154(b) by 0 days.

(21) Appl. No.: 15/668,394

(22) Filed: Aug. 3, 2017

(65) Prior Publication Data

US 2018/0233632 A1 Aug. 16, 2018

Related U.S. Application Data

(63) Continuation of application No. 14/936,620, filed on Nov. 9, 2015, now abandoned, which is a (Continued)

(51) Int. Cl.
*H01L 33/50* (2010.01)
*F21V 8/00* (2006.01)
(Continued)

(52) U.S. Cl.
CPC ............ *H01L 33/502* (2013.01); *B41F 15/00* (2013.01); *C09K 11/02* (2013.01);
(Continued)

(58) Field of Classification Search
None
See application file for complete search history.

(56) References Cited

U.S. PATENT DOCUMENTS

| 5,998,925 | A | 12/1999 | Shimizu |
| 6,072,272 | A | 6/2000 | Rumbaugh |

(Continued)

FOREIGN PATENT DOCUMENTS

| JP | 2000286454 | 10/2000 |
| JP | 2002241586 A | 8/2002 |

(Continued)

OTHER PUBLICATIONS

The International Search Report dated Aug. 23, 2012 for PCT/US2011/063057.

(Continued)

*Primary Examiner* — Francisco W Tschen
(74) *Attorney, Agent, or Firm* — Vista IP Law Group, LLP

(57) ABSTRACT

A photoluminescent composition ("phosphor ink") comprises a suspension of particles of at least one blue light (380 nm to 480 nm) excitable phosphor material in a light transmissive liquid binder in which the weight loading of at least one phosphor material to binder material is in a range 40% to 75%. The binder can be U.V. curable, thermally curable, solvent based or a combination thereof and comprise a polymer resin; a monomer resin, an acrylic, a silicone or a fluorinated polymer. The composition can further comprise particles of a light reflective material suspended in the liquid binder. Photoluminescence wavelength conversion components; solid-state light emitting devices; light emitting signage surfaces and light emitting signage utilizing the composition are disclosed.

17 Claims, 7 Drawing Sheets

Related U.S. Application Data continuation of application No. 13/308,066, filed on Nov. 30, 2011, now abandoned.

(60) Provisional application No. 61/419,099, filed on Dec. 2, 2010.

(51) Int. Cl.
  *G02F 1/1335* (2006.01)
  *C09K 11/02* (2006.01)
  *C09K 11/77* (2006.01)
  *B41F 15/00* (2006.01)
  *H01L 33/60* (2010.01)

(52) U.S. Cl.
  CPC ...... *C09K 11/7734* (2013.01); *C09K 11/7774* (2013.01); *G02B 6/005* (2013.01); *H01L 33/60* (2013.01); *G02F 1/133615* (2013.01); *G02F 2001/133614* (2013.01); *H01L 33/501* (2013.01); *H01L 2933/0041* (2013.01); *H01L 2933/0058* (2013.01)

(56) References Cited

U.S. PATENT DOCUMENTS

| | | |
|---|---|---|
| 7,311,858 B2 | 12/2007 | Wang |
| 7,390,437 B2 | 6/2008 | Dong |
| 7,575,697 B2 | 8/2009 | Li |
| 7,601,276 B2 | 10/2009 | Li |
| 7,655,156 B2 | 2/2010 | Cheng |
| 7,863,808 B2 | 1/2011 | Terao |
| 7,937,865 B2 | 5/2011 | Li et al. |
| 8,044,575 B2 | 10/2011 | Kawamura |
| 8,274,215 B2 | 9/2012 | Liu et al. |
| 8,400,396 B2 | 3/2013 | Feng et al. |
| 8,539,702 B2 | 9/2013 | Li et al. |
| 8,597,545 B1 | 12/2013 | Liu et al. |
| 8,618,559 B2 | 12/2013 | Hamaguchi et al. |
| 8,631,598 B2 | 1/2014 | Li et al. |
| 8,663,502 B2 | 3/2014 | Tao et al. |
| 8,795,817 B2 | 8/2014 | Kwak et al. |
| 8,796,050 B2 | 8/2014 | Yoo et al. |
| 8,796,712 B2 | 8/2014 | Ooyubu et al. |
| 2001/0019240 A1 | 9/2001 | Takahashi |
| 2002/0067443 A1* | 6/2002 | Bayley ............. G02F 1/133617 349/61 |
| 2002/0142156 A1 | 10/2002 | Maloney |
| 2005/0083465 A1 | 4/2005 | Niiyama |
| 2006/0158090 A1 | 7/2006 | Wang et al. |
| 2007/0031097 A1* | 2/2007 | Heikenfeld ............ G02B 26/02 385/129 |
| 2007/0138438 A1* | 6/2007 | Hampden-Smith ...... B01J 2/003 252/301.36 |
| 2007/0240346 A1 | 10/2007 | Li et al. |
| 2008/0111472 A1 | 5/2008 | Liu et al. |
| 2008/0116785 A1 | 5/2008 | Ohno et al. |
| 2008/0187762 A1* | 8/2008 | Hayashi .................. B29C 45/02 428/413 |
| 2008/0218992 A1 | 9/2008 | Li |
| 2009/0283721 A1 | 11/2009 | Liu et al. |
| 2010/0079980 A1 | 4/2010 | Sakai |
| 2010/0176751 A1* | 7/2010 | Oshio ..................... H01L 33/62 315/362 |
| 2010/0229741 A1 | 9/2010 | Kerz |
| 2010/0246160 A1* | 9/2010 | Ito .................... G02F 1/133603 362/84 |
| 2010/0265079 A1* | 10/2010 | Yin .................... H04N 5/35545 340/635 |
| 2010/0276712 A1 | 11/2010 | Shaikevitch et al. |
| 2010/0295079 A1 | 11/2010 | Melman |
| 2010/0301758 A1 | 12/2010 | Chen |
| 2010/0321339 A1 | 12/2010 | Kimmel |
| 2011/0261290 A1 | 10/2011 | Kim et al. |
| 2012/0112130 A1 | 5/2012 | Wu et al. |
| 2012/0286208 A1 | 11/2012 | McKean et al. |

FOREIGN PATENT DOCUMENTS

| | | |
|---|---|---|
| JP | 2002359404 A | 12/2002 |
| JP | 2003046133 | 2/2003 |
| JP | 2004153109 A | 5/2004 |
| JP | 2005277441 A | 10/2005 |
| JP | 2008130279 A | 6/2008 |
| JP | 2009102514 A | 5/2009 |
| JP | 2009158119 A | 7/2009 |
| JP | 2009530437 A | 8/2009 |
| JP | 2009209316 A | 9/2009 |
| JP | 2010151877 A | 7/2010 |
| TW | 200735411 A | 9/2007 |
| TW | 200814377 A | 3/2008 |
| TW | 200840092 A | 10/2008 |
| TW | 200926459 A | 6/2009 |
| TW | 200929621 A | 7/2009 |
| WO | WO 2010074963 A1 | 7/2010 |
| WO | WO 2010123059 A1 | 10/2010 |

OTHER PUBLICATIONS

International Preliminary Report on Patentability and Written Opinion of the International Searching Authority dated Aug. 23, 2012 for PCT/US2011/063057.
Non-Final Office Action dated Aug. 19, 2013 for U.S. Appl. No. 13/308,066.
Final Office Action dated Apr. 15, 2014 for U.S. Appl. No. 13/308,066.
Non-Final Office Action dated Jun. 2, 2014 for U.S. Appl. No. 13/941,236.
Notice of Allowance dated Nov. 21, 2014 for U.S. Appl. No. 13/941,236.
Non-Final Office Action dated Dec. 2, 2014 for U.S. Appl. No. 13/308,066.
Foreign Office Action dated Jun. 9, 2015 for Japanese Appin. No. 2013-542206.
Foreign Office Action dated Apr. 13, 2015 for Taiwanese Appin. No. 100144472.
1st Foreign Office Action dated Aug. 5, 2015 for Chinese Appln. No. 201180063987.6.
Final Office Action dated Jun. 8, 2015 for U.S. Appl. No. 13/308,066.
Non-Final Office Action dated Aug. 10, 2015 for U.S. Appl. No. 14/469,523.
Foreign Office Action dated Feb. 23, 2016 for Japanese Appln. No. 2013-542206.
Foreign Office Action dated Jun. 1, 2016 for Chinese Appln. No. 201180063987.6.
Notice of Allowanced dated Dec. 8, 2015 for U.S. Appl. No. 14/469,523.
Foreign Office Action dated Aug. 24, 2017 for Taiwanese Appln. No. 100144472.
Final Office Action dated Feb. 3, 2017 for U.S. Appl. No. 14/936,620.
Non-Final Office Action dated May 23, 2016 for U.S. Appl. No. 14/936,620.

* cited by examiner

SOLID-STATE LIGHT EMITTING DEVICES AND SIGNAGE WITH PHOTOLUMINESCENCE WAVELENGTH CONVERSION AND PHOTOLUMINESCENT COMPOSITIONS THEREFOR

CLAIM OF PRIORITY

This application is a continuation of U.S. application Ser. No. 14/936,620, filed on Nov. 9, 2015, which is a continuation of U.S. application Ser. No. 13/308,066, filed Nov. 30, 2011, which claims the benefit of priority to U.S. Provisional Patent Application No. 61/419,099, filed Dec. 2, 2010, all of which are incorporated herein by reference in their entireties.

BACKGROUND OF THE INVENTION

1. Field of the Invention

This invention relates to solid-state light emitting devices and signage with photoluminescence wavelength conversion and more particularly photoluminescent compositions therefor. In particular, although not exclusively, the invention concerns devices and signage based on LEDs (Light Emitting Diodes). The invention further concerns a method of manufacturing photoluminescence wavelength conversion components for solid-state light emitting devices and photoluminescence signage surfaces for light emitting signage.

2. Description of the Related Art

White light emitting LEDs ("white LEDs") are known and are a relatively recent innovation. It was not until LEDs emitting in the blue/ultraviolet part of the electromagnetic spectrum were developed that it became practical to develop white light sources based on LEDs. As taught, for example in U.S. Pat. No. 5,998,925, white LEDs include one or more phosphor materials, that is photoluminescent materials, which absorb a portion of the radiation emitted by the LED and re-emit light of a different color (wavelength). Typically, the LED chip or die generates blue light and the phosphor(s) absorbs a percentage of the blue light and re-emits yellow light or a combination of green and red light, green and yellow light, green and orange or yellow and red light. The portion of the blue light generated by the LED that is not absorbed by the phosphor material combined with the light emitted by the phosphor provides light which appears to the eye as being nearly white in color.

Due to their long operating life expectancy (>50,000 hours) and high luminous efficacy (70 lumens per watt and higher) high brightness white LEDs are increasingly being used to replace conventional fluorescent, compact fluorescent and incandescent light sources.

Typically the phosphor material is mixed with a silicone or epoxy material and the mixture applied to the light emitting surface of the LED die. As disclosed in United States patent application US 2008/0218992 A1 to Li, it is also known to provide the phosphor material as a layer on, or incorporate the phosphor material within an, optical component that is located remotely to the LED die.

United States patent application US 2007/0240346 A1, to Li et al., teach a solid-state light emitting sign in which blue light from an LED is used to excite phosphor materials on a light emitting signage surface to generate a desired color of light.

It is an object of the present invention to provide a photoluminescent composition for solid-state light emitting devices and signage with photoluminescence wavelength conversion that in part at least overcomes the limitations of the known devices.

SUMMARY OF THE INVENTION

Embodiments of the invention concern photoluminescent compositions that contain one or more phosphor materials that are excitable by blue light of wavelength 380 nm to 480 nm. In accordance with the invention the photoluminescent composition can be deposited onto a substrate as one or more layers of a uniform thickness by printing, in particular screen printing, letterpress printing, gravure printing, flexograph printing or pad printing.

According to the invention a photoluminescent composition comprises: a suspension of particles of at least one phosphor material in a light transmissive liquid binder in which the at least one phosphor material is excitable by blue light of wavelength 380 nm to 480 nm and wherein the weight loading of at least one phosphor material to binder material is in a range 40% to 75%.

The photoluminescent composition can be configured to be screen printable and the binder has a viscosity in a range 0.5 Pa·s to 5 Pa·s (Pascal-second=1kg·m$^{-1}$·s$^{-1}$). Preferably the binder has a viscosity of about 1 Pa·s (1000 cps (centipoise)) to 2.5 Pa·s.

Alternatively the photoluminescent composition can be configured to be inkjet printable with a viscosity of 0.004 Pa·s to 0.020 Pa·s. Inkjet printing can enable fine patterns of the composition to be printed.

In other arrangements the photoluminescent composition can be configured to be gravure or flexograph printable with a viscosity of 0.05 Pa·s to 5 Pa·s. A particular benefit of gravure and flexograph printing is that since the quantity of composition printed is determined by the size of the cavities in a plate or drum this enables accurate control of the thickness and uniformity of the printed layer.

In further arrangements the photoluminescent composition can be letterpress printable with a viscosity 50 Pa·s to 150 Pa·s.

In another arrangement the photoluminescent composition can be pad printable. Pad printing can be beneficial where the substrate onto which the composition is to be printed is non-planar for example where the substrate comprises a curved lens or a domed shaped cover.

The binder can be U.V. curable, thermally curable, solvent based or a combination thereof. The binder can comprise a polymer resin; a monomer resin, an acrylic or a silicone. The binder can comprise a fluorinated polymer to reduce degradation of the phosphor material by the uptake of moisture. Preferably the binder has a transmissivity of at least 0.9 for light of wavelength 400 nm to 750 nm. Advantageously where it is intended to print the composition on a light transmissive substrate the binder is selected such that, in a cured state, it has a refractive index that substantially matches the refractive index of the substrate. Such refractive index matching reduces refraction of light at the interface between the substrate and layer of photoluminescent composition. Typically the refractive index of the binder is greater than about 1.48 and is advantageously matched with the substrate to within 0.02. Preferably the binder has, in a cured state, an elasticity in a range 300% to 500%.

The at least one phosphor material can have an average particle size in a range 1 μm to 60 μm with the preferred particle size range being dependent on the intended printing technique for depositing the composition. For example for screen printable phosphor compositions the average particle is preferably in a range 10 µm to 20 µm and more preferably about 15 µm. In contrast inkjet printable compositions generally require the smallest particle size typically up to 5 µm. The at least one phosphor material preferably comprises a silicate phosphor; an orthosilicate phosphor; a nitride phosphor; an oxy-nitride phosphor; a sulfate phosphor, an oxy-sulfate phosphor, a garnet (YAG) phosphor or a combination thereof.

The inventors have discovered that by further suspending particles of a light reflective material in the liquid binder, this can increase photoluminescence light generation by the photoluminescent composition. It is believed that the increase in photoluminescence generated light results from the particles of light reflective material increasing the probability of collisions of photons with particles of the phosphor material. Initial test results indicate that the inclusion of the light reflective material can potentially, for a given color and intensity of light generated by the composition, reduce phosphor material usage by 33% or more. Such a reduction of phosphor material usage is particularly significant in applications where the composition is required over a large area such as signage applications in which the composition may be provided over several hundreds or even thousands of square centimeters. The light reflective material has a reflectivity that is as high as possible and is preferably at least 0.9. The light reflective material preferably comprises particles of magnesium oxide (MgO), titanium dioxide ($TiO_2$), barium sulfate ($BaSO_4$) or mixtures thereof. Typically the light reflective material has a particle size in a range 0.1 µm to 20 µm and preferably in a range 0.5 µm to 2 µm. The weight percent loading of light reflective material to phosphor material can be in a range 0.01% to 10%, preferably in a range 0.01% to 1% and more preferably in ranges 0.1% to 1% or 0.5% to 1%.

According to another aspect of the invention a wavelength conversion component for a solid-state light emitting device comprises a substrate having printed on a surface thereof at least one layer of the photoluminescent composition of the invention. Typically for solid-state light emitting devices as used in general lighting the photoluminescent composition is provided over an area of at least 0.8 $cm^2$ to 180 $cm^2$.

The wavelength conversion component can be light transmissive and configured to convert the wavelength of at least a portion of the light transmitted through the component. In one arrangement the wavelength conversion component comprises a light transmissive substrate on which the photoluminescent composition is provided as at least one layer. Alternatively the light transmissive substrate can be configured as a light guide and the photoluminescent composition provided on at least a part of a light emitting face of the light guide. To reduce light being refracted at the interface between the light transmissive substrate and the layer of photoluminescent composition the substrate and binder in a cured state have refractive indices that are within 0.02 of each other. The light transmissive substrate can comprise an acrylic poly(methyl methacrylate) (PMMA), a polycarbonate, a silicone or a glass.

Alternatively the wavelength conversion component can be light reflective and configured to convert the wavelength of at least a portion of the light reflected by the component. One such wavelength conversion component comprises a light reflective surface on which the photoluminescent composition is provided as at least one layer. The light reflective substrate can comprise any light reflective surface and preferably has a reflectance of at least 0.9. The light reflective surface can comprise a polished metallic surface such as silver (Ag), aluminum (Al), chromium (Cr); a light reflective polymer, a light reflective paper or a light reflective paint.

The concept of manufacturing a solid-state light emitting device or manufacturing a photoluminescence wavelength conversion component for a solid-state light emitting device by printing a photoluminescent composition containing one or blue light excitable phosphor materials is considered inventive in its own right. Accordingly in accordance with a further aspect of the invention a photoluminescence wavelength conversion component for a solid-state light emitting device comprises: a substrate having on a surface thereof a layer of a photoluminescent composition that is excitable by blue light of wavelength 380 nm to 480 nm and wherein the composition is deposited on the substrate using screen printing; inkjet printing; letterpress printing, gravure printing; flexograph printing or pad printing. Preferably the composition comprises a suspension of particles of at least one blue light excitable phosphor material in a light transmissive liquid binder and wherein the weight loading of at least one phosphor material to binder material is in a range 40% to 75%.

The composition can be printed such that it covers the entire light emitting surface of the substrate. Alternatively the composition can be printed as a pattern covering at least a part of the light emitting surface of the substrate. In one arrangement the composition is printed as a first order stochastic pattern comprising a pseudo random array of dots of substantially the same size. A particular benefit of using a stochastic pattern is that this can largely eliminate alignment issues when printing more than one layer or where it is required to print multiple different compositions. Moreover since the dots are the same size a first order stochastic pattern is particularly suited to screen printing where the dot size can correspond the screen mesh hole size. Alternatively the composition can be printed as a second order stochastic pattern comprising a pseudo random array of dots of varying size. In yet further arrangements the composition can be printed as a half tone pattern comprising a regular array of dots of varying size.

The photoluminescent composition can be printed as a pattern on substrates that are light transmissive or light reflective.

In accordance with another aspect of the invention a method of fabricating a photoluminescence wavelength conversion component for a solid-state light emitting device in which the component comprises a substrate having a layer of a phosphor material that is excitable by blue light of wavelength 380 nm to 480 nm, comprises: a) mixing particles of a blue light excitable phosphor material with a light transmissive binder wherein the weight loading of at least one phosphor material to binder material is in a range 40% to 75%; b) printing the composition as a layer over at least a part of a substrate; and c) at least partially curing the light transmissive binder. Where the surface of the substrate onto which the composition is to be printed is substantially planar the composition can be printed by screen printing; inkjet printing; letterpress printing, gravure printing or flexograph printing. Where the substrate surface is curved the composition can be printed by pad printing using a resiliently deformable printing pad.

In some applications it may be desirable for the substrate to be shaped rather than planar such as for example a dome-shaped or hemispherical shell. To fabricate such components the substrate preferably comprises a thermoplastics material having a substantially planar surface on which the composition is printed. The method further comprises heating the substrate and forming the component into a selected shape. To ensure a uniform thickness layer of the composition in the finished component the method further comprises, during printing the composition, selectively varying the thickness of the layer such that after forming the component into a selected shape the resulting composition layer is of a substantially uniform thickness. To prevent the layer(s) of photoluminescent composition separating (delaminating) from the substrate during forming of the substrate the binder advantageously has in a cured state an elasticity of 300% to 500%. Such a method of fabrication a wavelength conversion component is considered to be inventive in its own right.

According to yet a further aspect of the invention a photoluminescent composition comprises a suspension of particles of at least one phosphor material in a light transmissive liquid binder wherein the phosphor material is excitable by blue light of wavelength 380 nm to 480 nm and wherein the binder has in a cured state an elasticity of 300% to 500%.

According to yet another aspect of the invention a light emitting device comprises at least one solid-state light emitter, typically an LED, that is operable to generate blue light and a wavelength conversion component in accordance with the various aspects of the invention.

Whilst the various aspects of the invention arose in relation to solid-state light emitting devices the photoluminescent compositions of the invention further find application to solid-state light emitting signage in which the photoluminescent wavelength conversion component comprises a photoluminescence light emitting signage surface. According to another aspect of the invention a signage surface comprises a substrate having printed on a surface thereof at least one layer of the photoluminescent composition of the invention. The composition can be configured as a pattern to define an image, picture, letter, numeral, device, pattern or other signage information. Alternatively, as for example is required for channel lettering, the shape of the signage surface, substrate, can be configured to define signage information. Typically the substrate is light transmissive and can be backlit or edge lit. The substrate can comprise an acrylic, a polycarbonate, an epoxy, a silicone or a glass. Where the signage surface is backlit, that is one or more solid-state light emitters are located behind the signage surface which is configured as a light transmissive window such that a proportion of blue light passing through the component will be converted to light of a different color by the phosphor material, the signage surface is preferably located at a distance of at least 5 mm from the light emitters. Alternatively where the sign is edge lit the substrate is configured as a light guide and the photoluminescent composition printed on at least a part of a light emitting face of the light guide. Typically the substrate will be planar and light can coupled into the light guide from one or more edges of the substrate.

In signage applications the light emitting surface will often be much greater than that in lighting applications and the composition will typically be provided over an area of at least 100 cm$^2$.

In accordance with yet another aspect of the invention a light emitting sign comprises at least one solid state light emitter operable to generate blue light and a signage surface in accordance with the invention.

BRIEF DESCRIPTION OF THE DRAWINGS

In order that the present invention is better understood photoluminescent compositions, solid-state light emitting devices, photoluminescence wavelength conversion components and light emitting signage in accordance with embodiments of the invention will now be described, by way of example only, with reference to the accompanying drawings in which.

DETAILED DESCRIPTION OF THE INVENTION

Figure 1:
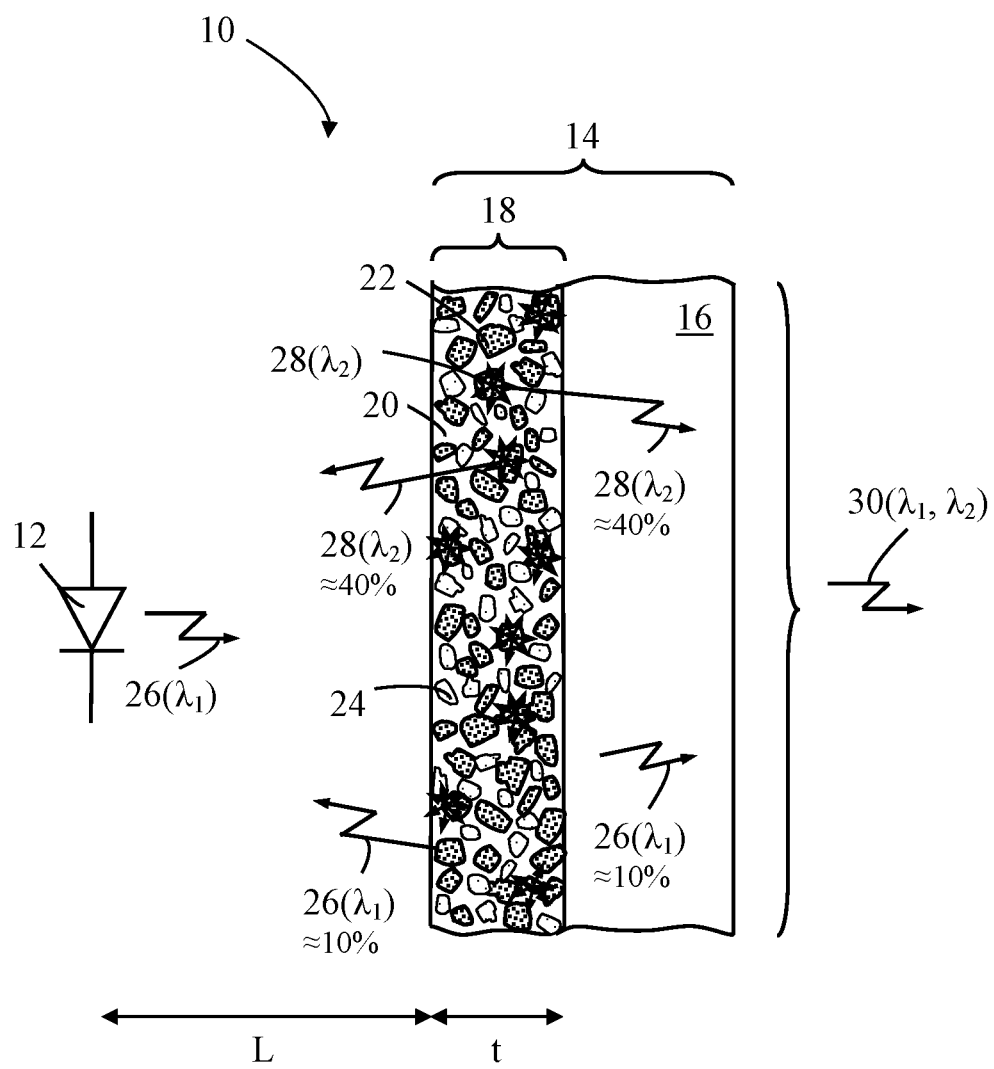
FIG. 1 is schematic representation of an LED-based light emitting device with a light transmissive photoluminescence wavelength conversion component in accordance with an embodiment of the invention.

Embodiments of the invention concern photoluminescent compositions for use with photoluminescence wavelength conversion components for solid-state light emitting devices and light emitting signage. In particular, although not exclusively, the invention relates to photoluminescent compositions that can be deposited by printing. The concept of printing the photoluminescent composition to manufacture a photoluminescence wavelength conversion component for solid-state light emitting devices is believed to be inventive in its own right. Since the photoluminescent compositions are preferably printable they will in this specification and for the sake of brevity, be referred to as "phosphor inks". It will be appreciated however that the use of this term does not restrict the invention to printable photoluminescent compositions and that the phosphor ink can be deposited by other methods such as for example spraying, spin coating, slit coating, dipping or sweeping the phosphor ink over the surface of a substrate using a blade such as a squeegee (e.g. doctor blading).

Throughout this patent specification like reference numerals are used to denote like parts.

FIG. 1 is a schematic representation of an LED-based white light emitting device 10 in accordance with an embodiment of the invention. The device 10 comprises a blue light emitting LED (blue LED) 12 and a light transmissive photoluminescence wavelength conversion component 14 located remotely to the LED 12. The wavelength conversion component 14 can comprise a light transmissive substrate (window) 16 having, on at least one face, one or more layers of a phosphor ink 18 that constitutes a photoluminescence wavelength conversion layer. The phosphor ink 18 comprises a light transmissive binder material 20 with particles of a blue light excitable phosphor material 22 homogeneously distributed throughout its volume. As indicated in FIG. 1 the phosphor ink 18 can optionally further comprise particles of a light reflective material 24 homogeneously distributed throughout its volume. To provide physical protection of the wavelength conversion layer 18 it is preferred, as indicated in FIG. 1, that the wavelength conversion component 14 is configured such that the wavelength conversion layer 18 faces the LED.

The substrate 16 can comprise any light transmissive material such as a polymer material for example an acrylic poly(methyl methacrylate) (PMMA) or polycarbonate or a glass such as fused silica or a borosilicate glass such as Pyrex (Pyrex is a brand name of Corning Inc). The light transmissive material can also comprise an optical quality silicone or epoxy. The substrate 16 can be planar such as a circular disc though it can be square, rectangular or other shapes depending on the intended application. Where the substrate is disc-shaped the diameter can be between about 1 cm and 153 cm (6 inches) that is an aperture of area of between 0.8 cm² and 184 cm². In alternative embodiments the substrate 16 can be non-planar and comprise other geometries such as a spherical or dome-shaped shell, a part cylindrical surface or an optical component that directs light in a selected direction such as a convex or concave lens. To reduce the transfer of heat from the LED 12 to the wavelength conversion component 14, in particular heat transfer to the phosphor material, the wavelength conversion component is located remote to the LED, that is physically separated from the LED, by a distance L of at least 5 mm. Locating the wavelength conversion component 14 remote to the LED provides a number of benefits namely reduced thermal degradation of the phosphor material. Additionally compared with devices in which the phosphor material is provided in direct contact with the light emitting surface of the LED die, providing the phosphor material remote to the LED reduces absorption of backscattered light by the LED die. Furthermore locating the phosphor material remotely enables generation of light of a more consistent color and/or CCT since the phosphor material is provided over a much greater area as compared to providing the phosphor directly to the light emitting surface of the LED die.

The blue LED 12 can comprise a GaN-based (gallium nitride-based) LED that is operable to generate blue light 26 having a peak wavelength $\lambda_1$ in a wavelength range 380 nm to 480 nm (typically 440 nm to 450 nm). The blue LED 12 is configured to irradiate the wavelength conversion component 14 with blue light 26 whereat a proportion is absorbed by the phosphor material 22 which in response emits light 28 of a different wavelength $\lambda_2$, typically yellow-green in color for a cold white light emitting device. The emission product 30 of the device 10 which is configured to appear white in color comprises the combined light 26 emitted by the LED and the light 28 generated by the phosphor material 20.

The phosphor material 22 and light reflective material 24, which are in powder form, are thoroughly mixed in known proportions with the liquid binder material 20 to form a suspension and the resulting phosphor ink deposited onto the substrate 16 to form a layer of substantially uniform thickness. In preferred embodiments the phosphor ink is deposited onto the substrate 16 by screen printing and the thickness t of the layer controlled by the number of printing passes. As will further be described the phosphor ink can be applied using other printing methods including inkjet, letterpress, gravure, flexograph or pad printing.

The phosphor material can comprise an inorganic or organic phosphor such as for example silicate-based phosphor of a general composition $A_3Si(O,D)_5$ or $A_2Si(O,D)_4$ in which Si is silicon, O is oxygen, A comprises strontium (Sr), barium (Ba), magnesium (Mg) or calcium (Ca) and D comprises chlorine (Cl), fluorine (F), nitrogen (N) or sulfur (S). Examples of silicate-based phosphors are disclosed in U.S. Pat. No. 7,575,697 B2 "Silicate-based green phosphors" (assigned to Intematix Corp.), U.S. Pat. No. 7,601,276 B2 "Two phase silicate-based yellow phosphors" (assigned to Intematix Corp.), U.S. Pat. No. 7,655,156 B2 "Silicate-based orange phosphors" (assigned to Intematix Corp.) and U.S. Pat. No. 7,311,858 B2 "Silicate-based yellow green phosphors" (assigned to Intematix Corp.). The phosphor can also comprise an aluminate-based material such as is taught in our co-pending patent application US2006/0158090 A1 "Novel aluminate-based green phosphors" and patent U.S. Pat. No. 7,390,437 B2 "Aluminate-based blue phosphors" (assigned to Intematix Corp.), an aluminum-silicate phosphor as taught in co-pending application US2008/0111472 A1 "Aluminum-silicate orange-red phosphor" or a nitride-based red phosphor material such as is taught in our co-pending United States patent application US2009/0283721 A1 "Nitride-based red phosphors" and International patent application WO2010/074963 A1 "Nitride-based red-emitting in RGB (red-green-blue) lighting systems". It will be appreciated that the phosphor material is not limited to the examples described and can comprise any phosphor material including nitride and/or sulfate phosphor materials, oxy-nitrides and oxy-sulfate phosphors or garnet materials (YAG).

The phosphor material comprises particles with an average particle size of 10 μm to 20 μm and typically of order 15 μm. The phosphor material can comprise particles of a size 2 μm to 60 μm depending in part on the intended technique to be used to deposit the phosphor ink.

The light reflective material 22 comprises a powdered material with as high a reflectivity as possible typically a reflectance of 0.9 or higher. The particle size of the light reflective material is typically in a range 0.1 μm to 10 μm and in a preferred embodiment is within a range 0.1 μm to 10 μm. The weight percent loading of light reflective material to phosphor material is in a range 0.1% to 10% and in a preferred embodiment in a range 1% to 2%. Examples of light reflective materials include magnesium oxide (MgO), titanium dioxide ($TiO_2$) and barium sulfate ($BaSO_4$). The light reflective material can also comprise a white ink such as for example Norcote International Inc's super white ink GN-027SA which already includes particles of a highly light reflective material, typically $TiO_2$ (up to about 42% by weight).

In operation blue light 26 from the LED passes through the binder material 20 until it strikes a particle of phosphor material 22. It is believed that on average as little as 1 in 1000 interactions of a photon with a phosphor material particle results in absorption and generation of photoluminescence light 28. The majority, about 99.9%, of interactions of photons with a phosphor particle result in scattering of the photon. Due to the isotropic nature of the scattering process on average half of the photons will scattered in a direction back towards the LED. Tests indicate that typically about 10% of the total incident blue light 26 is scattered and emitted from the wavelength conversion component 14 in a direction back towards the LED. For a cool white light emitting device the amount of phosphor material is selected to allow approximately 10% of the total incident blue light to be emitted from the window and contribute to the emission product 30. The majority, approximately 80%, of the incident light is absorbed by the phosphor material and re-emitted as photoluminescence light 28. Due to the isotropic nature of photoluminescence light generation, approximately half of the light 28 generated by the phosphor material will be emitted in a direction towards the LED. As a result only up to about 40% of the total incident light will be emitted as light 28 of wavelength $\lambda_2$ and contributes to the emission product 30 with the remaining (up to about 40%) of the total incident light being emitted as light 28 of wavelength $\lambda_2$ in a direction back towards the LED. Typically light emitted towards the LED from the wavelength conversion component is re-directed by a light reflective chamber (not shown) to contribute to the emission product and to increase the overall efficiency of the device.

The inventors have discovered that the inclusion of particles of a light reflective material 24 increases the number of times a photon is scattered and thereby increases the probability that a photon will result in the generation of photoluminescence light. Preliminary tests indicate that by including particles of a light reflective material with the phosphor material in the phosphor ink this can reduce, by up to 33%, the amount of phosphor material required to generate a given color emission product. It is believed that the particles of light reflective material increase the probability of photons striking a particle of phosphor material and thus for an emission product of a given color less phosphor material is required.

Figure 2:
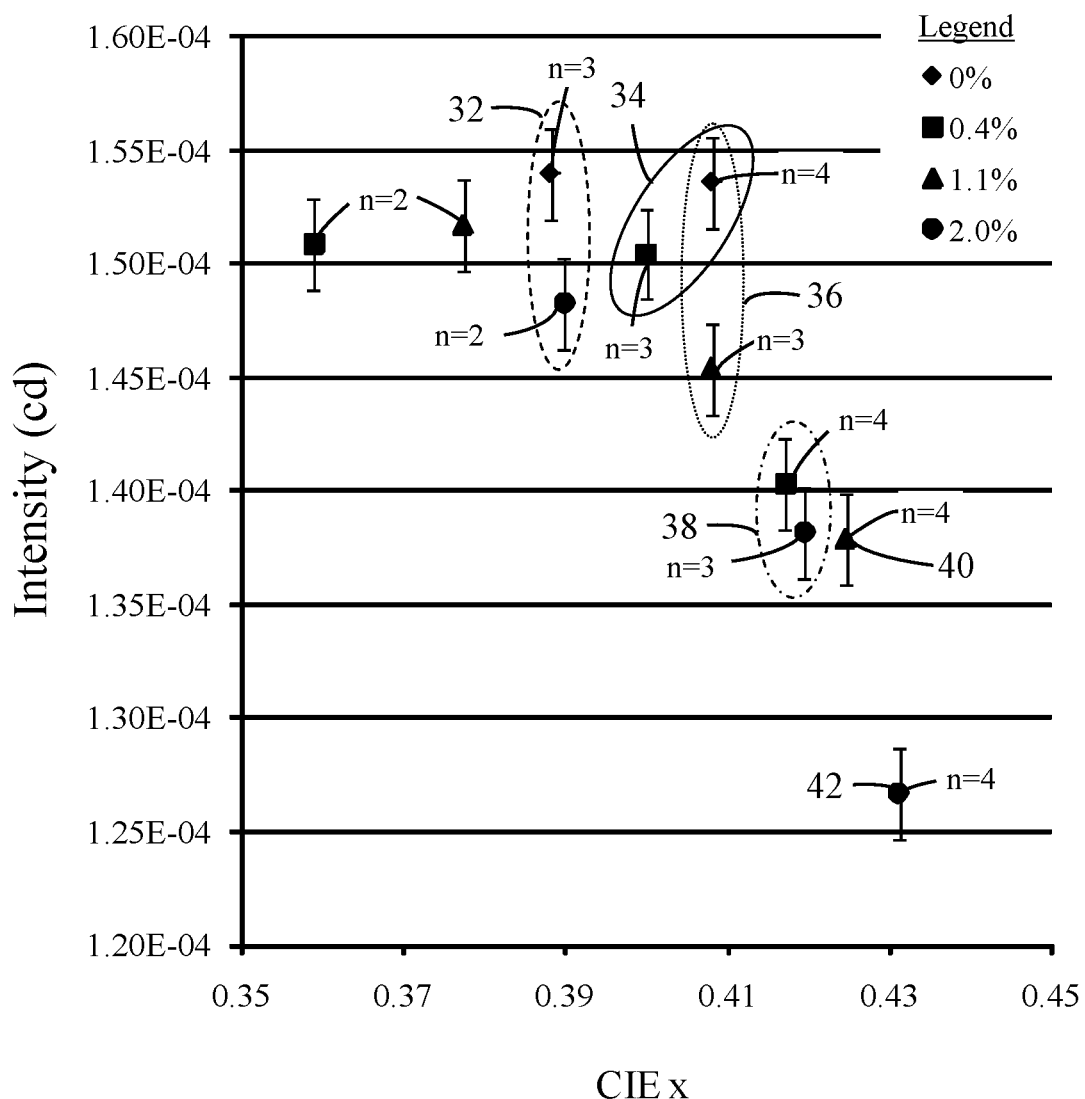
FIG. 2 is a plot of emission intensity versus chromaticity CIE x for an LED-based light emitting device in accordance with the invention for different weight percent loadings of light reflective material.

FIG. 2 is a plot of emission intensity versus chromaticity CIE x for a light emitting device in accordance with the invention for weight percent loadings of light reflective material of ♦—0%, ■—0.4%, ▲—1.1% and ●—2%. The data are for screen printed wavelength conversion layers 18 in which the binder material 20 comprises Nazdar's® UV curable litho clear overprint PSLC-294 and the phosphor material comprises Intematix Corp.'s yellow (565 nm) silicate phosphor EY4453 with an average particle size of 15 µm. The ratio of phosphor material 22 to binder material 20 is in a proportion of 2:1 by weight. The light reflective material 24 comprises Norcote International Inc's super white ink GN-027SA. The numbers for loading of light reflective material refer to weight percent of super white ink 24 to total phosphor ink composition (binder material+ phosphor material). The smaller reference numerals associated with each data point indicate the number 'n' of print passes used to form the wavelength conversion layer 18. It will be appreciated that the thickness t of the wavelength conversion layer 18 is proportional to the number of print passes. The ovals 32, 34, 36, 38 are used to group data points for emission products that have substantially the same intensity and CIE x values. For example oval 32 indicates that an emission product of similar intensity and color can be produced for wavelength conversion layers 18 comprising a) 3 print passes without light reflective material and b) 2 print passes with a 2% loading of light reflective material. These data indicate that by the inclusion of a 2% weight loading of light reflective material 24 it is possible to generate the same color and intensity of light with a phosphor ink comprising about 33% less phosphor material. Oval 34 indicates that the same intensity and color of emission product is produced for wavelength conversion layers 18 comprising a) 4 print passes without light reflective material and b) 3 print passes with a 0.4% loading of light reflective material. These data indicate that by the inclusion of a 0.4% weight loading of light reflective material the same color and intensity of light can be produced with a phosphor ink comprising about 25% less phosphor material. Oval 36 indicates that the same intensity and color of emission product is produced for wavelength conversion layers 18 comprising a) 4 print passes without light reflective material and b) 3 print passes with a 1.1% loading of light reflective material. These data indicate that by the inclusion of a 1.1% weight loading of light reflective material the same color and intensity of light can be produced with a phosphor ink comprising about 25% less phosphor. Oval 38 indicates that the same intensity and color of emission product is produced for wavelength conversion layers 18 comprising a) 4 print passes with a 0.4% weight loading of light reflective material and b) 3 print passes with a 2% weight loading of light reflective material. These data indicate by the inclusion of a 0.4% weight loading of light reflective material that the same color and intensity of light can be produced with a phosphor ink comprising about 25% less phosphor. Points 40 (n=4, 1.1% loading) and 42 (n=4, 2% loading) suggest that a saturation point exists above which an increase in light reflective material loading results in a decrease in emission intensity with little effect on the color.

Figure 3:
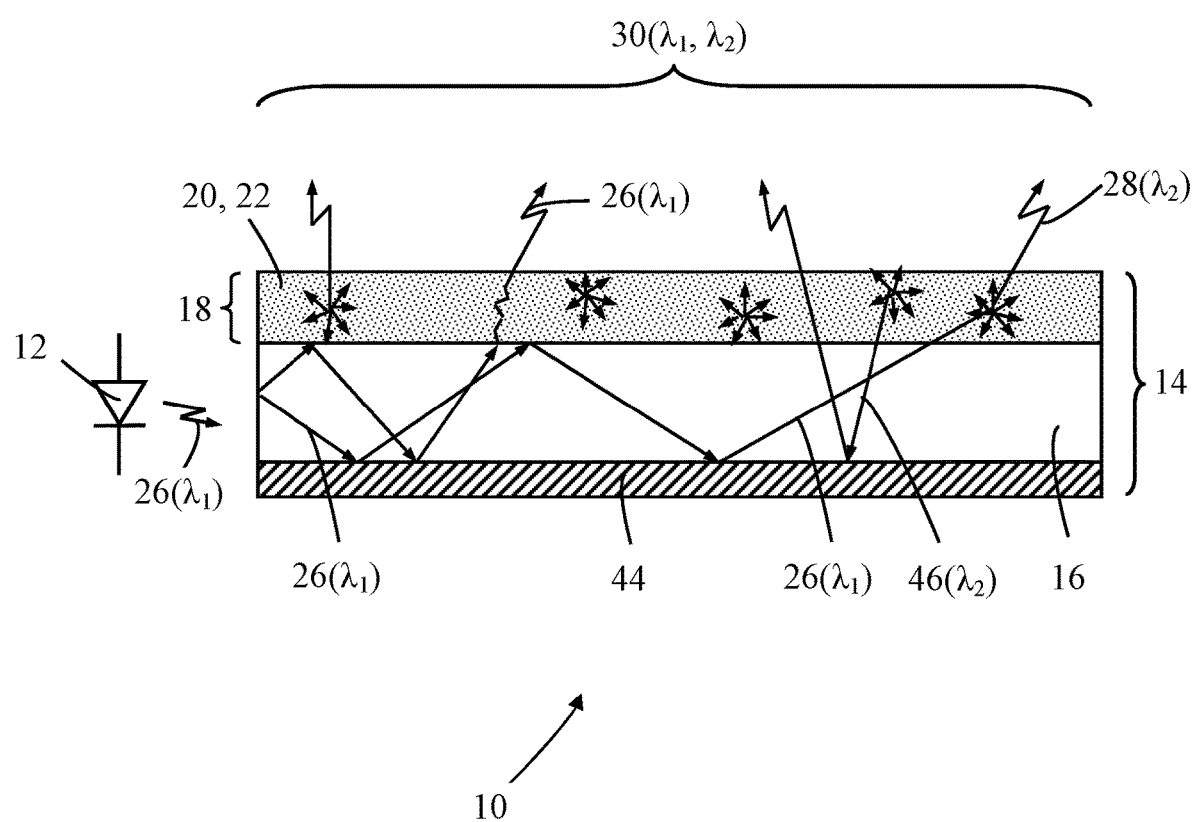
FIG. 3 is a schematic representation of an LED-based light emitting device with a light transmissive photoluminescence wavelength conversion component configured as a light guide in accordance with an embodiment of the invention.

FIG. 3 is a schematic representation of an LED-based white light emitting device 10 in accordance with another embodiment of the invention. In this embodiment the light transmissive substrate 16 is configured as a light guide (waveguide) and the wavelength conversion layer 18 is provided (printed) over the light emitting face of the substrate. Typically the substrate 16 is substantially planar and can be disc-shaped, square, rectangular or other shapes depending on the application. Where the substrate is disc-shaped the diameter can typically be between about 5 cm and 30 cm corresponding to a light emitting face of area of between about 20 cm$^2$ and about 700 cm$^2$. Where the substrate is square or rectangular in form the sides can typically be between about 5 cm and 40 cm corresponding to a light emitting face of between about 80 cm$^2$ and about 5000 cm$^2$. On the non-light emitting face (the lower face as illustrated) of the substrate 16 a layer of light reflective material 44 can be provided to prevent the emission of light from the rear of the device. The reflective material 44 can comprise a metallic coating such as chromium or a glossy white material such as a plastics material, paint or paper. To minimize light being emitted from the edges of the substrate, the edges of the substrate preferably include a light reflective surface (not shown). One or more blue LEDs 12 are configured to couple blue light 26 into one or more edges of the substrate 16. In operation light 26 coupled into the substrate 16 is guided throughout the entire volume of the substrate 16 by total internal reflection. Light 26 striking the light emitting face of the substrate at angles above a critical angle will be emitted through the face and into the phosphor wavelength conversion layer 18. Operation of the device is the same as that described with reference to FIG. 1. As indicated in FIG. 3 phosphor generated light 46 emitted in directions away from the light emitting face can re-enter the substrate 16 and will eventually be emitted through the light emitting face by being reflected by the light reflective layer 44. The emission product 30 emitted by the device is the combination of the blue light 26 generated by the LED and wavelength converted light 28 generated by the phosphor wavelength conversion layer 18.

Figure 4:
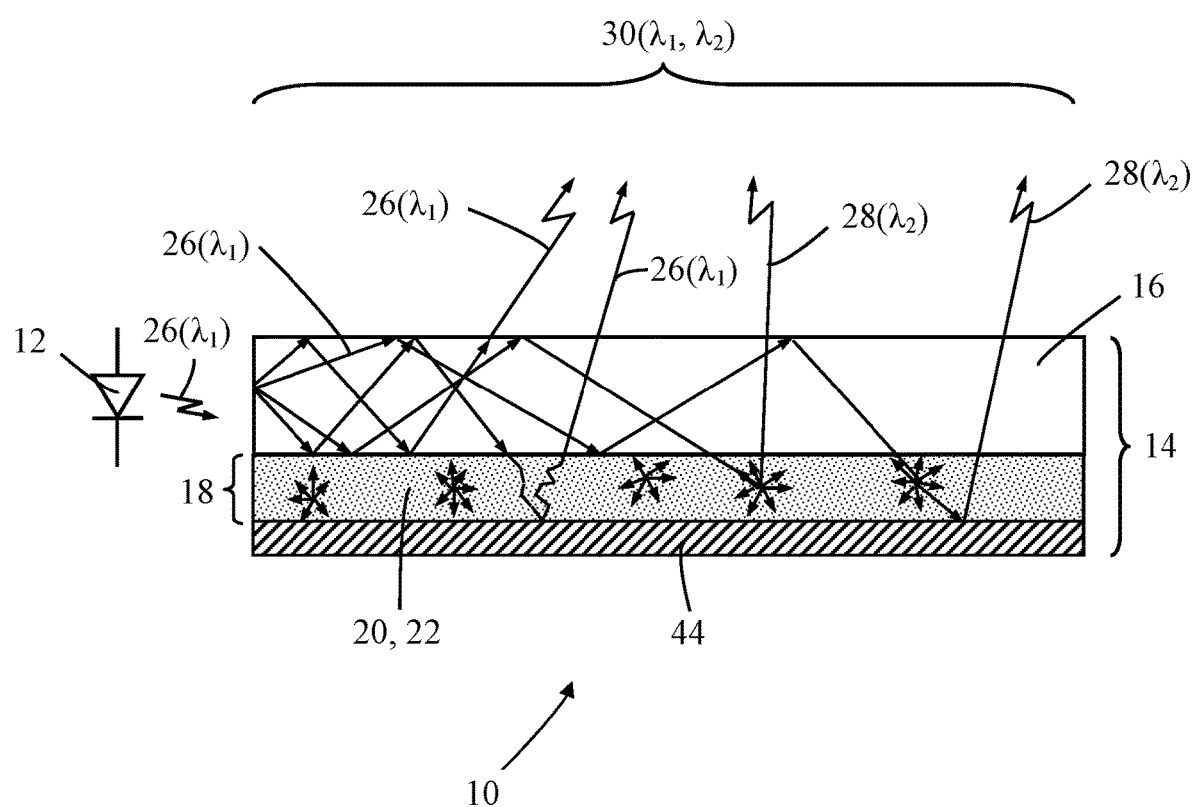
FIG. 4 is a schematic representation of an LED-based light emitting device with a light transmissive photoluminescence wavelength conversion component configured as a light guide in accordance with another embodiment of the invention.

FIG. 4 is a schematic representation of an alternative LED-based white light emitting device 10 in which the light transmissive substrate 16 is configured as a light guide. In this embodiment the phosphor conversion layer 18 is provided on the face of the substrate that is opposite to the light emitting face and the light reflective layer 44 is provided over the phosphor conversion layer 18.

Figure 5:
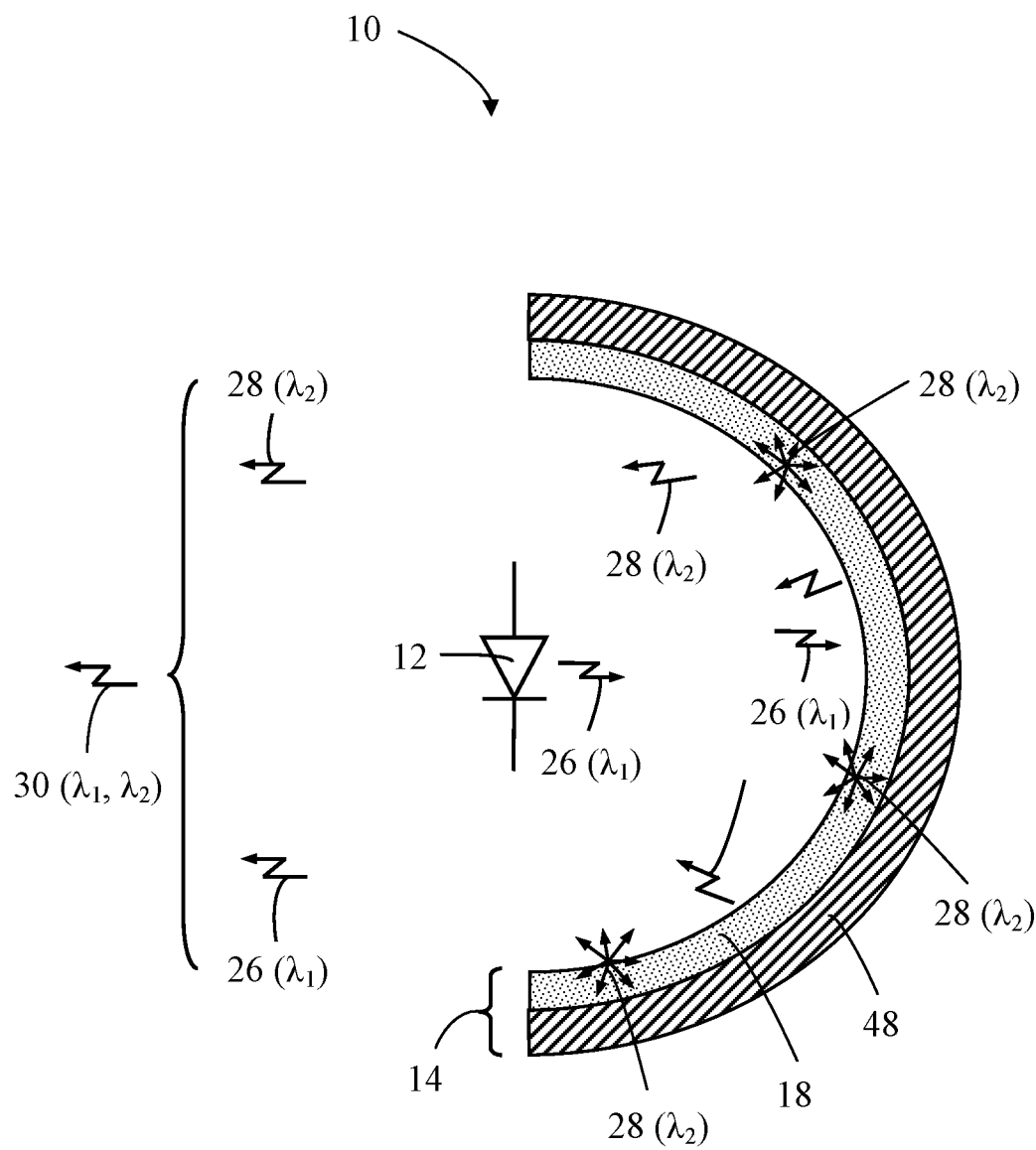
FIG. 5 is a schematic representation of an LED-based light emitting device with a light reflective photoluminescence wavelength conversion component in accordance with an embodiment of the invention.

FIG. 5 shows a schematic representation of an LED-based white light emitting device 10 in accordance with a further embodiment of the invention. In this embodiment the wavelength conversion component 14 is light reflective and is configured to convert the color of light reflected by the component. The wavelength conversion component 14 comprises a light reflective substrate 48 with the wavelength conversion layer 18 provided on a light reflective surface of the component. As shown the light reflective substrate 48 can comprise a parabloidal surface though it can comprise any surface including planar, hemispherical, part cylindrical, convex and concave shaped surfaces. To maximize light emission from the device, the light reflective surface is as reflective as possible and preferably has a reflectance of at least 0.9. The light reflective surface can comprise a polished metallic surface such as silver, aluminum, chromium; a light reflective polymer, a light reflective paper or a surface including a light reflective coating such as a light reflective paint. To assist in the dissipation of heat the light reflective surface can also be thermally conductive.

Operation of the light emitting device of FIG. 5 is not described in detail as it is similar to that of FIG. 1. However it is to be appreciated that since on average up to half of the LED generated light 26 will travel through the wavelength conversion layer 18 twice, the thickness of the wavelength conversion layer 18 can be of up to half ($\approx$t/2) compared to arrangements with a light transmissive wavelength conversion component (FIG. 1). As a result of providing the phosphor material on a light reflective surface the same color of emission product can be achieved with a further potential reduction of up to 50% in phosphor material usage.

The concept of manufacturing a photoluminescence wavelength conversion component for a solid-state light emitting device by printing a layer of phosphor ink on a substrate (light transmissive or light reflective) is believed to be inventive in its own right. To ensure that the wavelength conversion component produces a uniform color of emitted light over its entire surface, the wavelength conversion layer 18 can be printed as one or more uniform thickness layers that cover the entire light emitting surface of the substrate. In other embodiments the phosphor ink can be printed as a pattern covering a part or the whole of the surface of the substrate. For example the phosphor ink can be printed as a series of parallel lines, a regular pattern such as a checkerboard pattern or an irregular pattern.

Figure 6A:
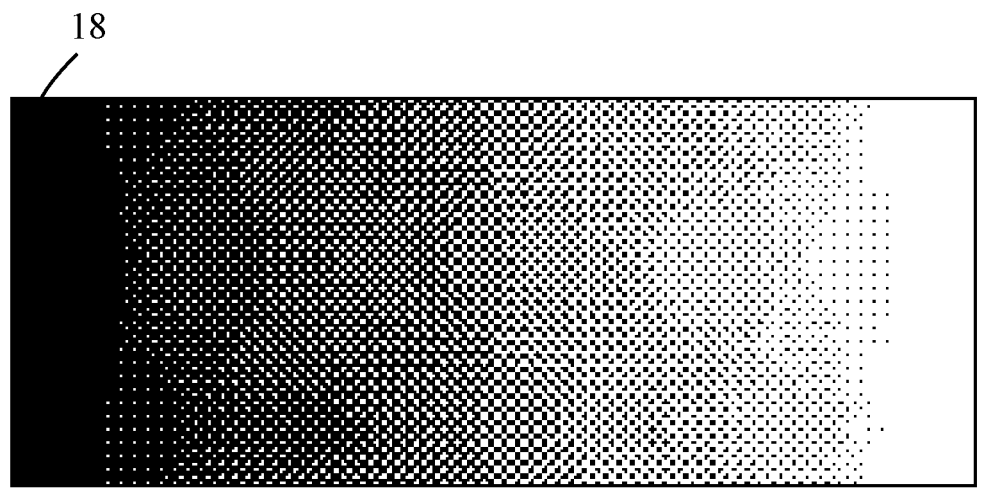
FIG. 6*a* printed phosphor ink pattern based on AM (amplitude modulated) half tone screening.
Figure 6B:
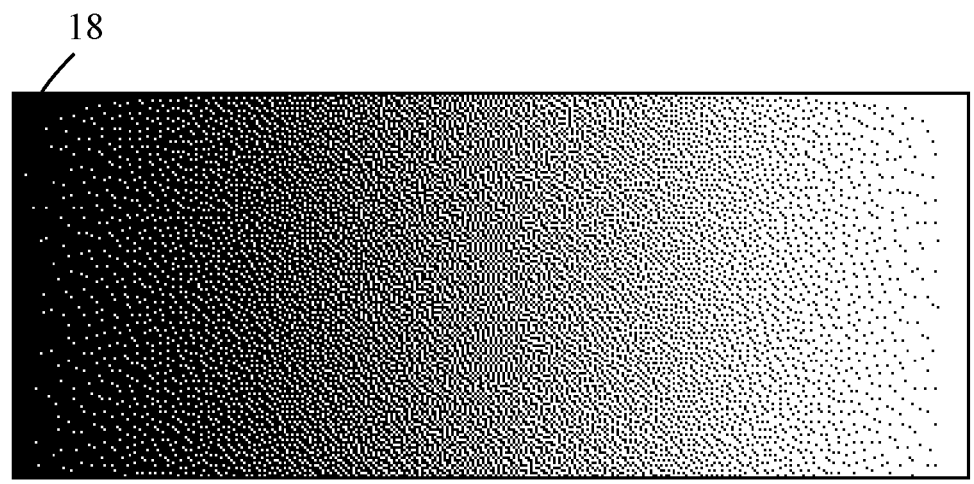
FIG. 6*b* printed phosphor ink pattern based on a first order stochastic or FM (frequency modulated) screening.

It is further envisioned in other applications to print the phosphor ink as a graded or graduated pattern. Such a graduated patterning can be used to compensate for variations in the color of emitted light across the substrate. For example it has been discovered that for a white light emitting device with a circular wavelength conversion component with a uniform phosphor conversion layer, light emitted from the center of the component can have a relatively higher proportion of blue light compared with light emitted around the periphery of the component. The result is that the emission product of such a device can be blue-white at the center surrounded by a yellow-white halo. It is believed that by printing relatively more phosphor ink at the center of the substrate compared with the edges this can reduce at least in part such haloing. More phosphor ink can be provided on a selected region of the substrate by a) selectively printing more phosphor ink layers at such regions or b) preferably by printing the phosphor ink as a graduated pattern in which the phosphor ink covers a greater proportion per unit area of the substrate in such regions. FIGS. 6a and 6b respectively show graduated printed phosphor ink pattern based on AM (amplitude modulated) half tone screening and first order stochastic or FM (frequency modulated) screening. In FIG. 6a the phosphor ink is printed as array of regularly spaced dots of varying size. Such a patterning is referred to as AM half tone screening as the amplitude (size) of the dots is modulated (varied) whilst the frequency (spacing) of the dots remains fixed. In FIG. 6b the phosphor ink is printed as a first order stochastic pattern comprising a pseudo-random array of phosphor dots of the same size in which the frequency (density) of dots is varied. Compared with a half tone patterning a first order stochastic pattern can be easier to print since the dot size is fixed and is preferred for screen printing since the dot size can correspond to the screen mesh size. Moreover a stochastic pattern can be preferred where it is required to make multiple print passes or to print patterns comprising two or more phosphor inks since such a random patterning is less sensitive to alignment issues. It is further envisioned to print the phosphor ink using a second order stochastic screening in which both the frequency and amplitude of the dots are modulated.

Figures 7A, 7B, 7C, 7D, 7E:
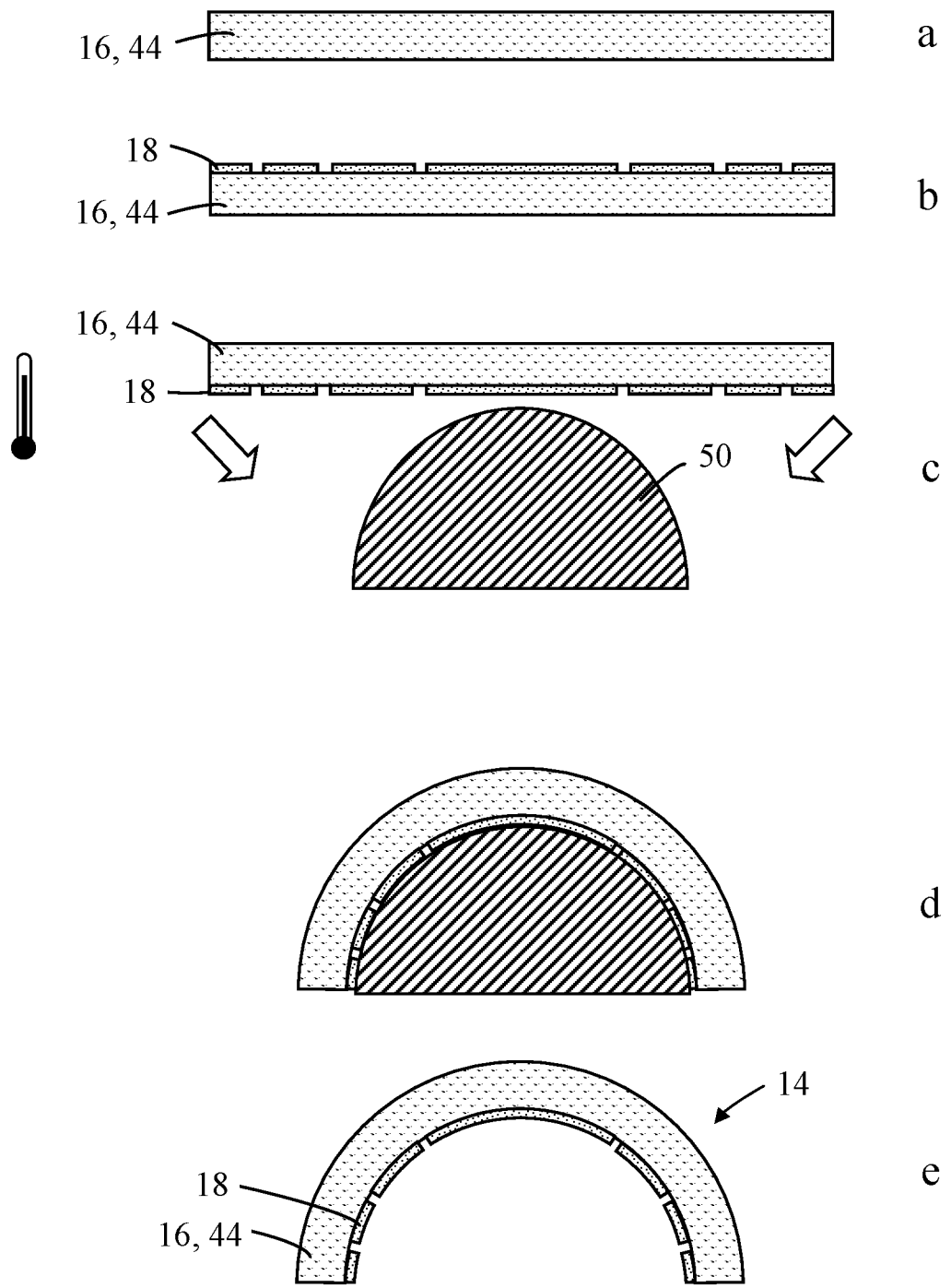
FIGS. 7*a* to 7*e* are schematic representations illustrating a method of manufacture of a dome-shaped photoluminescence wavelength conversion component.

FIGS. 7a to 7e illustrate a method of manufacturing a shaped (i.e. non-planar) wavelength conversion component 14 such as a hemispherical, parabloidal or cylindrical-shaped components. The wavelength conversion component 14 can be light transmissive (FIG. 1) or light reflective (FIG. 5). For either component the substrate 16, 48 onto which the phosphor ink is to be deposited comprises a thermally formable material typically a thermoplastic polymer material such as an acrylic poly(methyl methacrylate) (PMMA) or PET (Polyethylene terephthalate). Polycarbonate can also be used but is not preferred for phosphor inks in which the binder materials is based on a conventional ink as these can exhibit de-lamination problems. Acrylic and PET are preferred substrate materials due to their strong adhesion and easy thermal forming capabilities. To enable the phosphor ink to be readily deposited it is preferred that at least the surface of the substrate onto which the phosphor ink is to be deposited is substantially planar (FIG. 7a). The phosphor ink is printed, typically screen printed, onto the substrate to form a substantially uniform thickness layer (FIG. 7b). As indicated the phosphor ink can be printed as a pattern or as a layer covering the entire surface of the substrate. The substrate is them formed into a selected shape by for example vacuum and thermal forming using a mold or former 50 (FIGS. 7c and 7d). After cooling the finished wavelength conversion component 14 is removed from the mold (FIG. 7e).

When printing the phosphor ink on such components it is contemplated to account for local changes in the thickness of the wavelength conversion layer that can arise during the forming process. Such expected changes can be compensated by printing proportionally thicker layers of phosphor ink at regions of the substrate that will be deformed most in the final wavelength conversion component and proportionally thinner layers printed where the substrate is deformed less or results in a compression of the wavelength conversion layer. In this way it is possible to fabricate complex shaped wavelength conversion components having a consistent and predictable thickness wavelength conversion layer.

Phosphor Inks

As described phosphor inks in accordance with the invention comprise a light transmissive binder material 20 that is loaded with at least one phosphor material 22 and can optionally further include particles of a light reflective material 24.

The color of the emission product produced by the wavelength conversion component will depend on the quantity of phosphor material per unit area in the wavelength conversion layer. It will be appreciated that the quantity of phosphor material per unit area is dependent on the thickness of the wavelength conversion layer and the weight loading of phosphor material to binder. In applications in which the emission product is white or in applications in which the emission product has a high saturation color (i.e. the emission product comprises substantially all photoluminescence generated light) the quantity of phosphor material per unit area in the wavelength conversion layer will typically be between 10 and 40 mg·cm$^{-2}$. To enable printing of such a wavelength conversion layer in a minimal number of steps the phosphor ink preferably has as high a solids loading of phosphor material to binder material as is suitable for the selected printing (deposition) method. Alternatively phosphor inks with a lower solids loading of phosphor material can be used though multiple layers will need to be deposited to achieve a selected conversion emission product color.

For many applications, in particular those where the emission product comprises white light, it is necessary for the phosphor ink to allow a proportion of the blue light from the LED to pass through. In general white light and cooler colors will use the native blue light direct from the LED as the blue light component in the emission product. Accordingly the wavelength conversion layer must be configured to not only generate the required proportion of photoluminescence light but also allow an appropriate proportion of blue light to pass through. For cool white light the proportion of blue light pass through is approximately 10%-30% depending on the color temperature of the emission product (a lower proportion is used for warm light). Control of the amount of blue light pass through will also depend on the solids loading of phosphor material in the phosphor ink and the thickness t of the wavelength conversion layer. In pass through mode the phosphor inks act as a diffuser to the blue light and aids in color blending.

Red light emitting LEDs (red LEDs) can be a very efficient and low cost way of generating the red component of warm colors and warm white light. For some applications including general lighting, LED backlights, transportation and especially those applications requiring white light with a high CRI (Color Rendering Index) it can be desirable to use red LEDs combined with blue LEDs in the light source used to excite the wavelength conversion component. In such devices the phosphor ink must allow for red light pass through as well. Since none of the red light will be converted by the phosphor material the phosphor ink should have a maximum transmittance of red light (typically at least 60%). In operation the blue pass through light would be used for the blue component, green and yellow phosphors in the inks for the mid range colors and red LED pass through light would used as the red component.

Phosphor Ink Binder Material

Typically the binder material 20 comprises a curable liquid polymer such as a polymer resin, a monomer resin, an acrylic-poly(methyl methacrylate) (PMMA), an epoxy (polyepoxide), a silicone or a fluorinated polymer. It is important that the binder material 20 is, in its cured state, transmissive to all wavelengths of light generated by the phosphor material 24 and LED 12 and preferably has a transmittance of at least 0.9 over the visible spectrum (380 to 800 nm). The binder material 20 is preferably U.V. curable though it can be thermally curable, solvent based or a combination thereof. U.V. or thermally curable binders can be preferable because, unlike solvent-based materials, they do not "outgas" during polymerization. When a solvent evaporates the volume and viscosity of the composition will change resulting in a higher concentration of phosphor material which will affect the emission product color of the device. With U.V. curable polymers, the viscosity and solids ratios are more stable during the deposition process with U.V. curing used as to polymerize and solidify the layer after deposition is completed. Moreover since in the case of screen printing of the phosphor ink multiple-pass printing is often required to achieve a required layer thickness, the use of a U.V. curable binder is preferred since each layer can be cured virtually immediately after printing prior to printing of the next layer.

As well as providing a light transmissive suspension medium for the phosphor material the binder also acts as a protective encapsulation for the phosphor material protecting it from moisture and air which can damage the phosphor material's performance. To enhance hermetic sealing of the phosphor material, the binder material can comprise a polyimide, a fluorinated plastics material or a silicone. In addition to the hermetic properties of the binder, the permeability of the substrate to moisture and air should also be taken into account. For optimal performance the light transmissive substrate comprises a glass, a multilayered structure including one or more light transmissive inorganic hermetic layers or a plastics material with a low permeability to water and air. The substrate and binder material thus combine to create a protected phosphor layer during the printing process. Additionally a protective layer can be printed, laminated or otherwise deposited onto the substrate or onto the wavelength conversion layer to maximize protection of the phosphor material.

For applications in which the substrate 16, 48 is substantially planar or in which the substrate is only mildly re-formed after printing the wavelength conversion layer, the binder material 20 can have a low elasticity (i.e. an elastic limit 100% or lower). Where it is intended to re-form the substrate after printing the phosphor ink to create wavelength conversion components of more complex shapes (e.g. domes, dishes, hemispheres, spherical shells etc—FIGS. 7a to 7e) the binder material 20 preferably has an elasticity with an elastic limit of 300%-500%.

Where the photoluminescence wavelength component is light transmissive it is desirable to match as closely as practicable the refractive index of the binder material (in a cured state) with the refractive index of the light transmissive substrate to minimize the refraction of light at the interface between the substrate and wavelength conversion layer. TABLE 1 gives refractive index values for various substrate materials. A preferred binder material is a U.V. curable acrylic adhesive that has a refractive index n=1.48. When used in conjunction with acrylic, silica, Pyrex and silicone substrates the refractive indices are matched to within about ±0.02. Preferably the binder material has a refractive index in a range 1.46 to 1.59.

TABLE 1

| Substrate material | Refractive index n |
|---|---|
| Polycarbonate | 1.584 to 1.586 |
| Acrylic (PMMA) | 1.491 |
| Fused silica | 1.459 |

TABLE 1-continued

| Substrate material | Refractive index n |
|---|---|
| Pyrex glass | 1.474 |
| Silicone | ≈1.46 |

Printable Phosphor Inks

The intended printing method used to deposit the phosphor ink will affect the required properties of the binder material, typically viscosity, weight loading of phosphor material to binder and when present phosphor/light reflective material loading/particle size. For example if the viscosity of the phosphor ink is too high it will not be possible to print the ink. Conversely if the viscosity is too low the phosphor material can tend to agglomerate during printing resulting in clusters of phosphor material in the printed layer.

The viscosity of the phosphor ink is primarily determined by the viscosity of the binder material and weight loading of phosphor/light reflective material. Thinning additives can be used during initial formulation of the phosphor ink to achieve a required viscosity and to "thin" the phosphor ink during printing. However care must exercised when thinning to maintain the solids loading since it is the phosphor material content (loading) and layer thickness, not viscosity, that determines the color of light generated by the phosphor ink.

As well as viscosity the surface tension of the binder material can affect the phosphor inks performance. For example if the surface tension of the phosphor ink is too high, bubbles can form during printing resulting in poor layer formation. Bubbles can also form in phosphor inks with a low surface tension and it is preferred to additionally add a de-foaming agent to the phosphor ink.

TABLE 2

| Phosphor ink | Viscosity (Pa · s) | | Phosphor weight loading |
|---|---|---|---|
| | Range | Preferred | |
| Inkjet | 0.004 to 0.020 | ≈0.014 | ≈25% |
| Gravure/flexograph | 0.05 to 0.5 | | |
| Screen printing | 0.5 to 5 | ≈1 | 40% to 75% |
| Letterpress | 50 to 150 | | |

Screen Printing Phosphor Inks

For screen printing the binder material preferably has a viscosity in a range 0.1 to 5 Pa·s (100 to 5000 cps) and preferably about 1 Pa·s to 2.5 Pa·S (1000 to 2500 cps). To reduce the number of print passes necessary to achieve a required quantity of phosphor material per unit area in the deposited wavelength conversion layer, the weight loading of phosphor material to binder is as high as possible and is preferably in a range 40% to 75% depending on the phosphor material density. It has been found that above about a 75% weight loading it can be difficult to ensure strong cohesion, adhesion and maintain printability of the phosphor ink. For weight loadings below about 40% it is found that five or more print passes are necessary to achieve a required phosphor material per unit area. In the phosphor inks of the invention the weight loading of phosphor material to binder material is much higher that weight loading of pigment in a conventional screen print ink. It has been discovered that efficient light conversion can be achieved when the mean particle size of the phosphor material is about 15 μm.

Gravure and Flexograph Phosphor Inks

In both gravure and flexograph printing a plate or drum with a pattern of holes or cavities are filed with ink during an application step. The plate or drum is then rolled over the substrate and the ink passes from the plate to the substrate with the quantity of ink being controlled by the size of the cavities. Flexograph printing generally uses a polymer plate and gravure generally uses a metal plate suitable for longer production runs. A particular advantage of gravure and flexograph printing for fabricating wavelength conversion layers is that each is capable of depositing relatively high volumes of phosphor ink in a single pass. Moreover, since the volume of ink is determined by the volume of the cavities the quantity of phosphor ink deposited is also accurately controlled. For gravure and flexograph printing the phosphor ink preferably has a viscosity in a range 0.05 to 0.5 Pa·s (50 to 500 cps).

Inkjet Phosphor Inks

For inkjet printing it is preferred that the phosphor ink has a very low viscosity typically in a range 0.004 to 0.020 Pa·s (4 to 20 cps), preferably about 0.014 Pa·s (14 cps), with about a 25% weight loading of phosphor material to binder (TABLE 2). For operation with piezoelectric inkjet printers with nozzles up to 100 μm the phosphor/light reflective material have an average particle size of less than about 10 μm. Inkjet printable phosphor inks can be preferable for custom applications and low volume production. It is envisioned to use the elevated temperatures during inkjet printing (up to 100° C.) to reduce the viscosity of the phosphor ink.

Compared with conventional inkjet ink pigments, the larger phosphor material particle size can result in a settling of the phosphor material within the phosphor ink. To reduce settling of the phosphor material it is envisaged to use an inkjet printer with a re-circulating system, such as for example those with a dual port print head from Spectra Inc, to continuously circulate the phosphor ink and thereby maintain a consistent solids loading during printing. This can be especially important where it is required to print very small areas of phosphor ink.

Additionally phosphor inks for inkjet printing can further include a surfactant to lower surface tension between the phosphor and binder materials assist in uniformly dispersing the phosphor material in the binder material for both steric and/or electrostatic dispersion.

Pad Printing Phosphor Inks

Pad printing is a well established technique for printing onto shaped (i.e. non-planar) substrates such as for example keyboard keys, golf balls and pen barrels. As is known a resiliently deformable pad, often made of silicone rubber, is used to transfer the ink from the printing plate to the substrate. The pad can be round in form "round pad", bar shaped "bar pad" or other shapes such as square or rectangular termed "loaf pads". Pad printing of phosphor inks is particularly preferred where the substrate has a simple shaped surface such as for example is part cylindrical, dished or dome shaped.

Blended Phosphor Inks

So far the phosphor inks have been described as including a single phosphor material. Such single phosphor inks are particularly useful where it is required to generate saturated colors. A selected emission product color can be attained by printing multiple layers or patterns, for example dot patterns, of different single phosphor inks.

In further embodiments the phosphor ink can comprise a blend of two or more phosphor materials having different emission characteristics to generate a selected emission product color. By blending different ratios of the phosphor materials different target emission colors can be achieved. A blended phosphor ink can provide a consistent ratio of color and simplifies printing by eliminating the need for multi-pass printing. Accordingly blended phosphor inks are particularly suitable for coating processes such as spraying, spin coating, slit coating or dipping for single wavelength conversion layers.

Light Emitting Signage with Photoluminescence Wavelength Conversion

Whilst the phosphor inks of the invention have been described in relation to wavelength conversion components for solid-state light emitting devices the invention can also be applied to other applications. In particular phosphor inks in accordance with the invention are particularly suitable for light emitting signs that use photoluminescence wavelength conversion to generate a selected color of light such as for example is taught in co-pending United States patent application US 2007/0240346 A1, to Li et al., the specification of which is incorporated herein by way of reference thereto.

It will be appreciated that in such light emitting signs the wavelength conversion component 14 can be used as the photoluminescence signage surface to generate signage information of a desired light color. The phosphor ink can be configured as a pattern to define an image, picture, letter, numeral, device, pattern or other signage information on the light transmissive substrate. Alternatively, as for example is required for channel lettering, the shape of the signage surface, that is the light transmissive substrate, can be configured to define signage information. Phosphor ink can be particularly advantageous in signage applications where the area of the light emitting signage surface is many hundreds of square centimeters requiring the phosphor material to be distributed over a minimum area of 100 cm² (10 cm by 10 cm) and more typically over many hundreds or even thousands of square centimeters. For such applications the inclusion of a light reflective material in the phosphor ink can provide a significant saving in phosphor material usage and a substantial reduction in manufacturing costs.

The signs can be backlit, that is, the LEDs are located behind the signage surface within for example a light box, and the signage surface provided overlaying the light box opening. Typically the signage surface is located at a distance of at least 5 mm from the LEDs. Alternatively the sign can be edge lit and the light transmissive signage surface configured as a light guide and the mixture of phosphor material and light reflective material provided on at least a part of a light emitting face of the light guide.

It will be appreciated that the invention is not limited to the exemplary embodiments described and that variations can be made within the scope of the invention. For example whilst the invention has been described in relation to LED-based light emitting devices and signage the invention also applies to devices based on other solid-state light emitters including solid-state lasers and laser diodes.

What is claimed is:

1. A method of manufacturing a photoluminescent wavelength conversion component for a solid-state light emitting device, comprising:
    mixing a blue light excitable phosphor material and a light reflective material with a U.V. curable light transmissive binder to form a composition, wherein the blue light excitable phosphor material has an average particle size of 10 μm to 20 μm, wherein a weight percent loading of the light reflective material to the blue light excitable phosphor material is 0.01% to 10%, wherein the light reflective material has a particle size in a range of 0.1 μm to 10 μm, the blue light excitable phosphor material being excitable by light of wavelength 380 nm to 480 nm;
    screen printing the composition as a layer over at least a part of a substrate, wherein the substrate and the light transmissive binder in a cured state have refractive indices that are within 0.02 of each other, and wherein the substrate is selected from the group consisting of: an acrylic, a polycarbonate, a silicone and a glass; and
    at least partially curing the light transmissive binder.

2. The method of claim 1, wherein the substrate comprises a thermoplastics material and further comprising heating the substrate to form a component of a selected shape.

3. The method of claim 1, wherein the substrate is selected from the group consisting of: an acrylic, a polycarbonate, a silicone and a glass.

4. The method of claim 1, and further comprising during screen printing, selectively varying a thickness of a deposition of the light transmissive binder such that after forming the photoluminescent wavelength conversion component into a selected shape, the light transmissive binder is of a substantially uniform thickness.

5. The method of claim 1, wherein the light transmissive binder has in a cured state an elasticity of 300% to 500%.

6. The method of claim 1, wherein the light transmissive binder has a viscosity 0.5 Pa·s to 5 Pa·s or 1 Pa·s to 2.5 Pa·s.

7. The method of claim 1, wherein the light transmissive binder is selected from the group consisting of: a polymer resin; a monomer resin; an acrylic, a silicone and a fluorinated polymer.

8. The method of claim 1, wherein the light transmissive binder has in a cured state an elasticity in a range 300% to 500%.

9. The method of claim 1, wherein the blue light excitable phosphor material is selected from the group consisting of: a silicate phosphor; an orthosilicate phosphor; a nitride phosphor; an oxy-nitride phosphor; a sulfate phosphor, an oxy-sulfate phosphor; and a garnet (YAG) phosphor.

10. The method of claim 1, wherein the light reflective material is selected from the group consisting of: magnesium oxide, titanium dioxide, barium sulfate and combinations thereof.

11. The method of claim 1, wherein the light reflective material has a particle size in a range of 0.1 μm to 1 μm.

12. The method of claim 11, wherein a weight percent loading of the light reflective material to the blue light excitable phosphor material is in a range 0.01% to 10%.

13. The method of claim 1, where the U.V. curable light transmissive binder is selected from the group consisting of: a polymer resin; a monomer resin, an acrylic, a silicone, and a fluorinated polymer.

14. The method of claim 1, and comprising screen printing the U.V. curable photoluminescent ink over an entire light emitting surface of the substrate.

15. The method of claim 1, and comprising screen printing the U.V. curable photoluminescent ink as a graduated pattern.

16. The method of claim 1, and comprising screen printing the U.V. curable photoluminescent ink as a first order stochastic pattern comprising a pseudo random array of dots of substantially the same size.

17. The method of claim 1, and comprising screen printing the U.V. curable photoluminescent ink as a second order stochastic pattern comprising a pseudo random array of dots of varying size.

* * * * *